United States Patent [19]

Kobayashi et al.

[11] Patent Number: 5,041,863
[45] Date of Patent: Aug. 20, 1991

[54] IMAGE RECORDING APPARATUS WHICH PROHIBITS STARTING OF A RECORDING OPERATION UNTIL COMPLETION OF PHOTOSENSITIVE RECORDING MEDIUM ADJUSTMENT

[75] Inventors: Masanari Kobayashi; Kenji Sakakibara, both of Ichinomiya, Japan

[73] Assignee: Brother Kogyo Kabushiki Kaisha, Japan

[21] Appl. No.: 596,017

[22] Filed: Oct. 11, 1990

[30] Foreign Application Priority Data

Oct. 31, 1989 [JP] Japan .................................. 1-285319

[51] Int. Cl.$^5$ ...................... G03B 27/32; G03B 27/52
[52] U.S. Cl. ........................................ 355/27; 355/51
[58] Field of Search ................... 355/27, 28, 100, 106, 355/50, 51; 354/301, 302; 430/138

[56] References Cited

U.S. PATENT DOCUMENTS

| | | | |
|---|---|---|---|
| 4,801,976 | 1/1989 | Hayashi | 355/28 |
| 4,903,070 | 2/1990 | Nakata et al. | 355/27 |
| 4,935,768 | 6/1990 | Ibuchi | 355/27 |
| 4,935,769 | 6/1990 | Ogura | 355/27 |
| 4,945,382 | 7/1990 | Yui et al. | 355/27 |

*Primary Examiner*—Richard A. Wintercorn
*Attorney, Agent, or Firm*—Oliff & Berridge

[57] ABSTRACT

An image recording apparatus for recording an image on a photosensitive recording medium employs an elongated continuous form photosensitive recording medium capable of receiving a latent image of an output image to be formed, and a cut sheet type of a developer recording medium which produces an output image upon reaction with the latent image on the photosensitive recording medium. The apparatus comprises an exposing unit having an exposure position at which the elongated continuous form photosensitive recording medium fed along a photosensitive recording medium feeding path is exposed to a light image to form a latent image thereon, a developing unit disposed downstream of the exposing unit with respect to the photosensitive recording medium path which develops the exposed photosensitive recording medium superposed with the developer medium, and a separating unit disposed downstream of the developing unit with respect to the photosensitive recording medium feeding path which separates the exposed photosensitive recording medium from the developer recording medium. The image recording apparatus further comprises a starting unit for starting a recording operation upon user operation thereof, a photosensitive recording medium feeding unit that feeds the photosensitive recording medium from a position downstream of the separation unit to the exposure position through the developing unit, and a prohibiting unit which prohibits the starting of a recording operation when the starting unit is actuated during a time at which the photosensitive recording medium is being fed from the position downstream of the separation unit to the exposure position. The present invention is also applicable to image recording machines which employ a single sheet type of recording medium.

16 Claims, 8 Drawing Sheets

Fig.8B

| ITEM | INSTRUCTIONS |
| --- | --- |
| S:1 | INDICATE READY STATE |
| S:2 | IS THE START SWITCH 91 ON? |
| S:3 | TURN ON LAMP 99 |
| S:4 | RECORDING |
| S:5 | RECORDING A PLURALITY OF IMAGES? |
| S:6 | FLASHING OF LAMP 99 |
| S:7 | ROLL UP SHEET 11 |
| S:8 | IS THE ROLLING UP OPERATION COMPLETE? |
| S:9 | IS THE START SWITCH 91 ON? |
| S:10 | SOUND WARNING BUZZER 101 |
| S:11 | TURN OFF LAMP 99 |

IMAGE RECORDING APPARATUS WHICH PROHIBITS STARTING OF A RECORDING OPERATION UNTIL COMPLETION OF PHOTOSENSITIVE RECORDING MEDIUM ADJUSTMENT

Cross-reference is made to the following copending applications of the same assignee which are filed concurrently herewith and disclose the same basic image recording system: U.S. patent application Ser. No. 07/595,405 filed Oct. 11, 1990 to Katsuyoshi Sonore and entitled "Image Recording Apparatus For Inhibiting The Deterioration Of Photosensitive Recording Medium"; U.S. patent application Ser. No. 07/595,411 filed Oct. 11, 1990 to Katsuyoshi Sonore et al and entitled "Image Recording Apparatus Which Discharges An Output Image Sheet Upon Photosensitive Recording Medium Adjustment"; and U.S. patent application Ser. No. 07/595,850 filed Oct. 11, 1990 to Shin Asai and entitled "Image Recording Apparatus Which Reduces The Wasting Of Photosensitive Recording Medium When Operating In A Plural Image Recording Mode". The above-listed applications are herein incorporated by reference.

BACKGROUND OF THE INVENTION

1. Field of the Invention The present invention relates to an image recording apparatus such as a copying machine or a printer in which a photosensitive recording medium is employed, and more particularly to such an image recording apparatus that employs a photosensitive recording medium which is used to form an output image sheet.

2. Discussion of the Related Art

Generally, an image recording apparatus which uses a photosensitive recording medium employs, for example, as disclosed in U.S. Pat. No. 4,903,070, the disclosure of which is herein incorporated by reference, an elongated web-like microcapsule sheet coated with a plurality of photo and pressure sensitive microcapsules, each microcapsule enveloping therein a chromogenic material and a photosensitive resin, and a developer sheet coated with a developing material which produces an output image upon reaction with the chromogenic material, as is well known in the art.

The image recording apparatus comprises means for receiving the elongated web-like microcapsule sheet wound around a cartridge shaft and retained in a cartridge, an exposing unit for exposing the microcapsule sheet disposed at an exposure table to form a latent image thereon, a developer sheet feeding unit for feeding a developer sheet from a developer sheet cassette which stores therein, for example, a stack of developer sheets toward an exposed microcapsule sheet, a pressure developing unit for pressurizing the exposed microcapsule sheet superposed with the developer sheet to thereby form an output image on the developer sheet, a separating unit for separating the exposed microcapsule sheet from the developer sheet, a taking-up unit for taking-up the separated microcapsule sheet, and a thermal fixing unit for fixing the output image on the developer sheet.

In this type of image recording apparatus, the elongated microcapsule sheet drawn out of the cartridge passes through the exposing unit, the pressure developing unit and the separating unit, and is taken-up by the taking-up unit. The developer sheet and superposed elongated microcapsule sheet containing the latent image are pressurized by the pressure developing unit, and are separated from each other by the separating unit and then the developer sheet is subjected to thermal fixing in the thermal fixing unit. At this time, the copying operation is completed.

However, upon completion of the above copying operation, the leading edge of an unexposed portion of the microcapsule sheet has passed through the pressure developing unit. If the next copying operation is immediately performed in the above mentioned situation, an unexposed portion of the microcapsule sheet, located between the trailing edge of the exposed area from the preceding copying operation (now located near the separating unit) and the leading edge of the next exposing area for the next copying operation (now located near the exposing unit), was not fully utilized, resulting in waste of photosensitive recording medium.

In order to prevent waste of the photosensitive recording sheet, U.S. Pat. No. 4,801,976, the disclosure of which is herein incorporated by reference, discloses a copying machine for copying an image on a photo-pressure sensitive recording sheet, which comprises an exposing unit for exposing the photo-pressure sensitive sheet placed at an exposure position to form a latent image thereon, a magnification detection unit for detecting the degree of magnification of the image exposed by the exposing unit, and an exposure area controlling unit for controlling a feeding unit in response to said detection unit, whereby the photo-pressure sensitive sheet is exposed by the exposing unit from a leading edge thereof.

However, in this type of conventional copying machine, while the leading edge of the photo-pressure sensitive recording sheet is being controlled to be located at the proper exposure position, depression of the copy start key starts a next copying operation on the photo-pressure sensitive recording sheet irrespective of the completion of the adjustment of the leading edge of the unexposed portion of the photo-pressure sensitive recording sheet to the exposure position. For the above mentioned reason, the adjustment of the leading edge of the photo-pressure sensitive recording sheet is stopped, and a next copying operation is performed prior to proper placement of the leading edge of the unexposed portion of the photosensitive recording sheet to the exposure position. Accordingly, an unexposed portion of the photo-pressure sensitive recording sheet is wasted.

OBJECTS AND SUMMARY OF THE INVENTION

It is therefore an object of the present invention to overcome the above described drawbacks and disadvantages and to provide an image recording apparatus with which a user can record an image on a photosensitive recording medium only after the completion of the adjustment of the leading edge of the unexposed portion of the photosensitive recording sheet to the exposure position has been completed. Thus, the image recording apparatus avoids the waste of photosensitive recording sheet material.

To attain these and other objects, according to the present invention, there is provided an image recording apparatus for recording an image on a recording medium. The recording apparatus comprises, for example: means for receiving a cartridge of a continuous form photosensitive recording medium; starting means for starting an operation of recording an image on the photosensitive recording medium upon operator operation thereof; exposing means for exposing the continuous form photosensitive recording medium located along a photosensitive recording medium feeding path, said exposing means having an exposure position at which a leading edge of a portion of the photosensitive recording medium is located prior to starting said operation of recording; developing means, disposed downstream of said exposing means with respect to said photosensitive recording medium path, for developing an exposed portion of the photosensitive recording medium to form an output image sheet; separating means, disposed downstream of said developing means with respect to said photosensitive recording medium feeding path, for separating the output image sheet from the photosensitive recording medium; photosensitive recording medium feeding means for feeding said photosensitive recording medium from a position adjacent the separating means to the exposure position through the developing means; and prohibiting means for prohibiting the starting of the operation of recording regardless of operation of said starting means as long as the photosensitive recording medium is being fed by said photosensitive recording medium feeding means from the position adjacent said separating means to the exposure position through the developing means along said recording medium feeding path.

In the above-described image forming apparatus of the present invention, an image recording apparatus can employ an elongated continuous form photosensitive recording medium capable of receiving a latent image of an output image to be formed, and a cut sheet type of a developer medium which provides the output image sheet upon reaction with the latent image on the photosensitive recording medium. An exposing means exposes the elongated continuous form photosensitive recording medium as it is fed along said recording medium feeding path at the exposure position to form an image thereon. The developing means develops the exposed photosensitive recording medium superposed with the developer medium to form the output image sheet. The separating means separates the exposed photosensitive recording medium from the developer recording medium. The photosensitive recording medium feeding means feeds said photosensitive recording medium from a position adjacent the separation means where it is located after being separated from the developer sheet to the exposure position through the developing means along a photosensitive recording medium feeding path. The prohibiting means prohibits starting of the operation of recording an image even if said starting means has been operated (actuated) during a time at which the photosensitive recording medium is being fed from the position adjacent said separation means to the exposure position through the developing means along said recording medium feeding path.

The present invention is also applicable to machines which use the single sheet type of recording medium such as shown in the above-incorporated U.S. Pat. No. 4,801,976.

Therefore a user will always record an image on the photosensitive recording medium after the completion of adjustment of the leading edge of the unexposed portion of the photosensitive recording medium to the exposure position, and the image recording apparatus thus avoids waste of the photosensitive recording sheet.

BRIEF DESCRIPTION OF THE DRAWINGS

The foregoing and other objects, features and advantages of the present invention will become more apparent by reading the following detailed description of a presently preferred embodiment of the invention, when considered in connection with the accompanying drawings, in which:

FIGS. 8A and 8B are a flow chart and table, respectively, showing operation of the controller of the second embodiment.

DETAILED DESCRIPTION OF THE PREFERRED EMBODIMENTS

Figure 1:
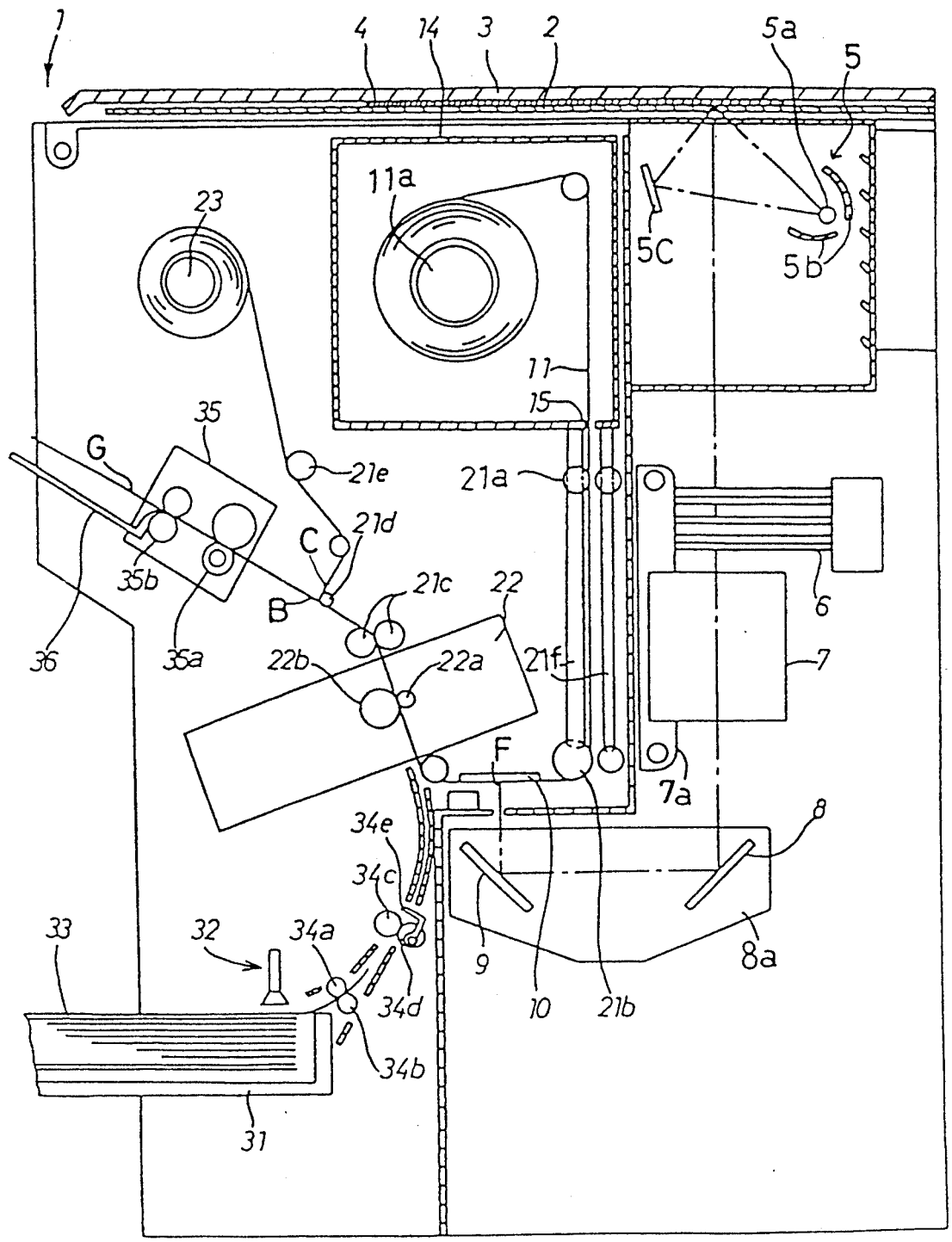
FIG. 1 is a schematic elevational view in cross section of one embodiment of an image recording apparatus of the present invention.

One embodiment according to the present invention is shown in FIGS. 1-4. FIG. 1 schematically shows an image recording machine according to an embodiment of the disclosed invention. The illustrated image recording machine, generally indicated at 1, is a photosensitive pressure-sensitive copying machine capable of copying and producing full-color images.

The photosensitive recording medium is of a transfer type recording medium which comprises a photosensitive recording medium and a developer recording medium. More specifically, the photosensitive recording medium comprises a photosensitive pressure sensitive recording medium provided with microcapsules which encapsulate therein a first material (chromogenic material or dye precursor) having first and second phases dependent on light exposure. The developer recording medium comprises the developer recording sheet coated on a substrate with a second material (developer material) which provides an output image upon reaction with the first material. Such an image recording medium is disclosed in, for example, U.S. Pat. No. 4,399,209 and Japanese Patent Application Kokai No. 58-88739.

The copying machine employs a continuous photosensitive pressure-sensitive recording sheet such as a microcapsule sheet 11 for recording a latent image thereon, and a developer sheet 33 for receiving a developed color image from the microcapsule sheet 11.

The copying machine 1 includes an upper panel assembly having an original support stand glass 2 which is movable back and forth and an original support stand glass cover 3 that can be placed over the original support stand glass 2. An original 4 to be copied is put on the original support stand glass 2, which is formed of light transmissive material. The copying machine 1 also has a light source 5 placed in an upper righthand portion thereof below the original support stand glass 2 comprising a halogen lamp 5a extending in a direction normal to the direction in which the original support stand glass 2 is movable back and forth, and semicylindrical reflecting mirrors 5b disposed in surrounding relation to the halogen lamp 5a. The light source 5 emits a linear-line of light toward the lower surface of the original support stand glass 2.

When the original support glass 2 moves, the light emitted from the halogen lamp 5a sequentially irradiates the entire surface of the original support stand glass 2 from the lefthand to the righthand end thereof (as viewed in FIG. 1). The light from the light source 5 passes through the transparent original support stand glass 2, and is then reflected by the original 4 placed on the original support stand glass 2. The original support stand glass cover 3 covers the entire upper surface of the original support stand glass 2 so that the light applied to the original support stand 2 will not leak out from those areas of the original support stand glass 2 which are not covered by the original.

A reflector 5c is positioned on the lefthand side of the light source 5 for applying light emitted from halogen lamp 5a to the original in a highly efficient manner. The reflector 5b reflects light emitted from lamp 5a which is not initially directed toward the original support glass 2.

The light reflected from the original 4 on the original support stand glass 2 is directed downwardly and passes through a filter 6 and a lens 7. The filter 6 serves to pass desired wavelengths of light dependent on the sensitivity of a microcapsule sheet 11 for adjusting the colors of a copied image. The lens 7 is mounted on a lens attachment 7a which is slightly adjustable with respect to the path of the light through the filter 6 and the lens 7.

The light converged by the lens 7 is directed 180 degrees by two reflecting mirror 8, 9 and then focused on the microcapsule sheet 11 held closely against the lower surface of an exposure table 10. The reflecting mirrors 8, 9 are mounted on a mirror attachment 8a which is slightly positionally adjustable to vary the length of the light path for focusing.

The microcapsule sheet 11 is of a continuously elongated length and is wound around a cartridge reel 11a and the wound microcapsule sheet 11 is placed in a removable cartridge 14 positioned below the original support stand glass 2. A leading end portion of the microcapsule sheet 11 which is provided with a leader consisting of a suitable sheet fixed to the leading edge of the photosensitive material extends through many rollers 21a, 21b, 21c, pressure developing unit 22 and a separator roller 21d toward a take-up reel 23. The photosensitive sheet roll is accommodated in the cartridge 14 such that the leader may be fed outside the cartridge 14 casing through the delivery slot 15, as illustrated in FIG. 1.

As shown in FIG. 1 the microcapsule sheet 11 which has been drawn out of the cartridge 14 is fed and guided by a feed roller 21a and a guide roller 21b, and extends beneath exposure table 10 into the pressure developing unit 22. The microcapsule sheet 11 which has passed through the pressure developing unit 22 is fed by a pair of feed rollers 21c, travels past a separator roller 21d and an adjustment roller 21e, and is then wound around the take-up reel 23. The microcapsule sheet 11 discharged from cartridge 14 is prevented from being prematurely exposed by a light-shielding cover 21f prior to reaching exposure table 10.

The speed at which the microcapsule sheet 11 is fed in an exposing operation is controlled so as to be held at a constant level, and remains the same speed at which the original support stand glass 2 is moved. Therefore, a latent image can be formed successively line by line on the microcapsule sheet 11 when it moves past the exposure table 10.

A developer sheet cassette 31 storing a stack of developer sheets 33 is disposed below the pressure developing unit 22. The developer sheets 33 are taken out of cassette 31 one at a time by a sheet feed mechanism 32 which attracts the developer sheets 33 with suction. Each developer sheet 33 which is taken from the cassette 31 is conveyed further by a feed roller 34a and a pinch roller 34b. After the leading end of the developer sheet 33 is aligned by rollers 34c, 34d and a resist gate 34e, the developer sheet 33 is fed into an inlet slot of the pressure developing unit 22.

The microcapsule sheet 11 and the developer sheet 33 are closely held against each other, when they are introduced into the pressure developing unit 22. The pressure developing unit 22 includes a small diameter roller 22a and a backup roller 22b. The microcapsule sheet 11 and the developer sheet 33 are sandwiched and pressed together between the small diameter roller 22a and the backup roller 22b. At this time, a microcapsule layer on the microcapsule sheet 11 with the latent image formed thereon and a color developer layer on the developer sheet 33 are held against each other. Those microcapsules in the microcapsule layer which are not exposed are ruptured under pressure, and a developed image is transferred onto the developer sheet 33.

The microcapsule sheet 11 and the developer sheet 33 which have left the pressure developing unit 22 are fed by the rollers 21c. Then, the microcapsule sheet 11 is separated from the developer sheet 33 by the separator roller 21d. The microcapsule sheet 11 is directed upwardly, whereas the developer sheet 33 travels straight ahead into a thermal fixing unit 35. The thermal fixing unit 35 includes a heater roller 35a and feed roller 35b. After color development on the developer sheet 33 is promoted and the color image is fixed by the heat fixing unit 35, the developer sheet 33 is discharged into a tray 36 with the developed image facing up.

The separated microcapsule sheet 11 travels past the adjustment roller 21e and is wound around the take-up reel 23.

The feed roller 21a is provided with a rotating plate 25c (not shown in Fig. 1 but shown in FIG. 2) located in encoder 25 to detect the speed of the feeding of the microcapsule sheet 11 described in detail below.

Figure 2:
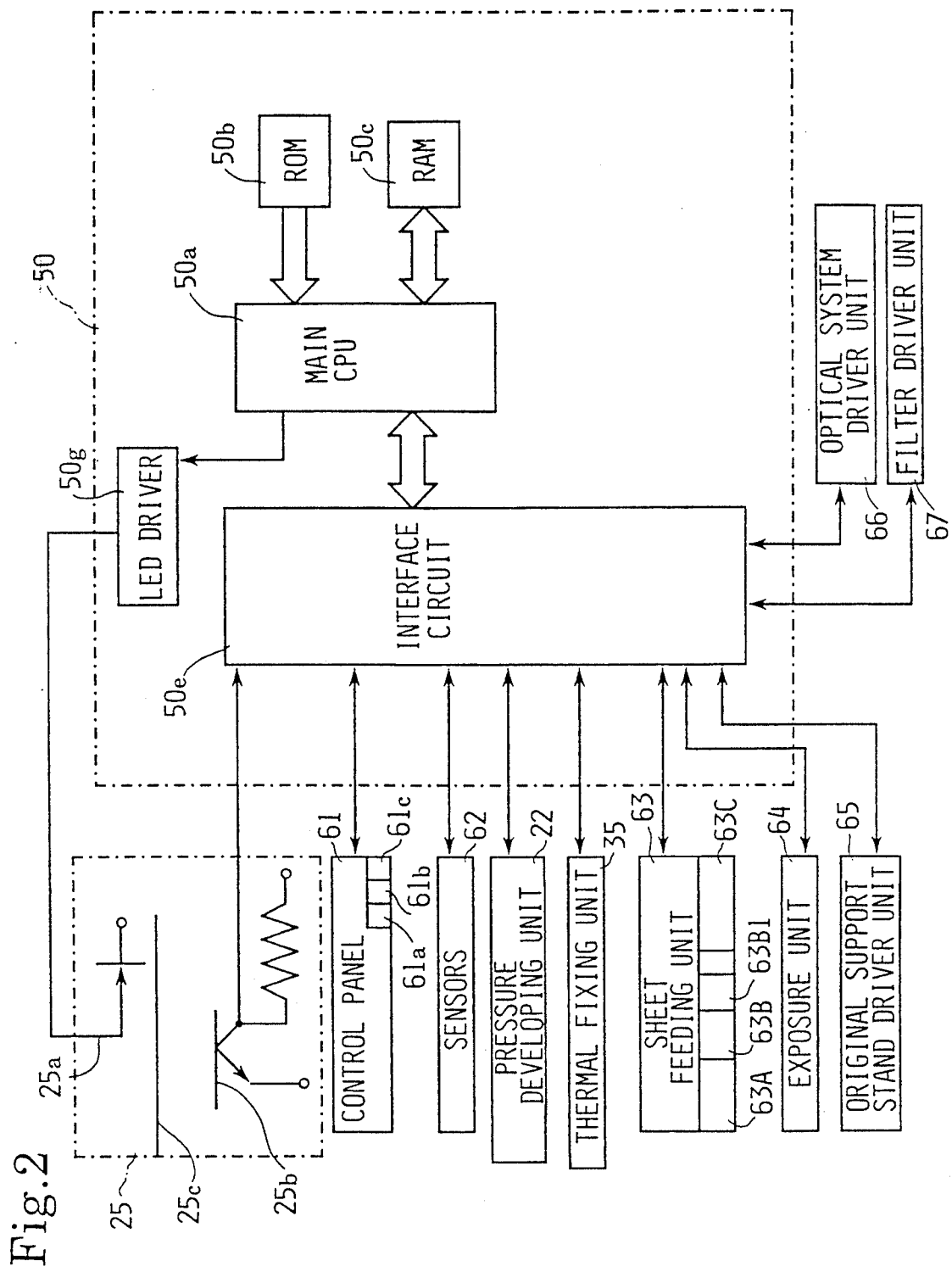
FIG. 2 is a block diagram showing a controller which includes an electrical control circuit.
Figure 3:
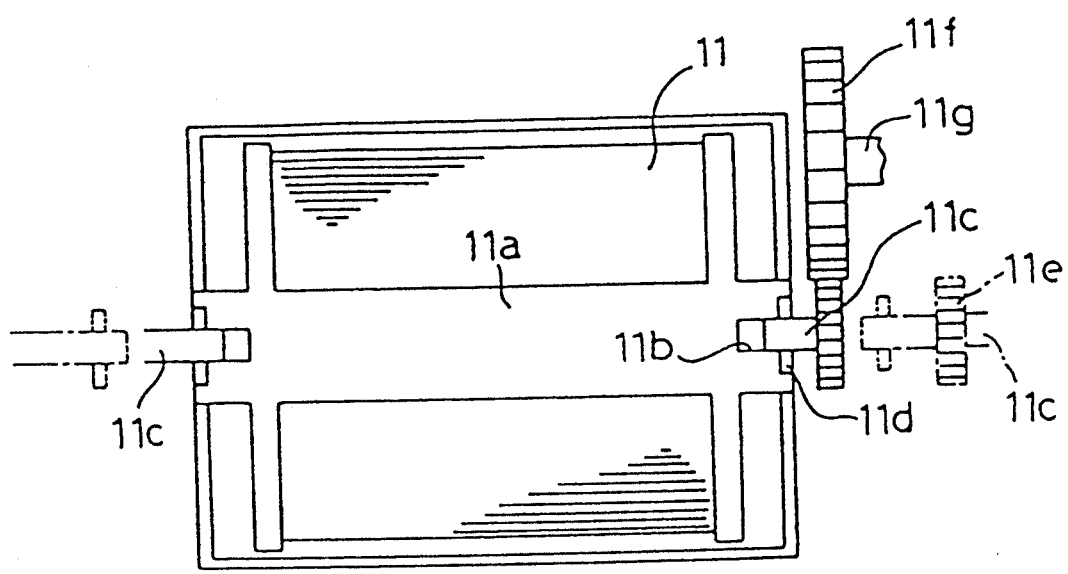
FIG. 3 is a schematic elevational view in cross section of a cartridge and a feeding mechanism for feeding the photosensitive pressure sensitive recording sheet.

As shown in FIG. 3, microcapsule sheet 11 is wound around a cartridge reel 11a in cartridge 14. The cartridge reel 11a has a pair of groove 11b at both sides thereof to engage with cartridge support shafts 11c provided in the present machine 1. The cartridge support shafts 11c are constructed for movement back and forth toward and away from the pair of grooves 11b, when the cartridge 14 is placed in or removed from machine 1. The pair of cartridge support shafts 11c have a pair of convex portions 11d which rotate the cartridge reel 11a when the pair of grooves 11b in the cartridge reel 11a are engaged by the convex portions 11d. A transmitting gear 11e is provided on one of the cartridge support shafts 11c and is attached thereto for rotation with this cartridge support shaft 11c. A driving gear 11f, disposed near gear 11e, is connected with a driving source 63B1 (not shown in FIG. 3 but shown in FIG. 2) through driving shaft 11g and is engageable with gear 11e.

In this case, when the cartridge support shafts 11c are moved into the pair of grooves 11b and the pair of grooves 11b are engaged with the convex portions 11d, the cartridge reel 11a receives the driving force from driving source 63B1 through the driving gear 11f, the transmitting gear 11e, and the cartridge support shaft 11c.

Accordingly, when the cartridge 14 is placed into machine 1, and the cartridge shaft 11a is engaged with the pair of cartridge support shafts 11c, the cartridge shaft 11a is rotated clockwise or counterclockwise by the driving source 63B1 through the driving shaft 11g, the driving gear 11f, the gear 11c and the convex portions 11d so as to roll up or unroll the microcapsule sheet 11 from around the cartridge shaft 11a.

There will next be described an arrangement of the controller 50, in the present apparatus 1 by reference to the block diagram shown in FIG. 2. The controller 50 includes an interface circuit 50e, and a main CPU (central processing unit) 50a, to which are connected through the interface circuit 50e, the encoder 25, a control panel 61, sensors 62, the pressure developing unit 22, the thermal fixing unit 35, a sheet feeding unit 63, an exposure unit 64, an original support stand driver unit 65, an optical system driver unit 66 and a filter driver unit 67.

The encoder 25 includes a rotating plate 25c having many slits disposed along a circumference thereof, a light-emitting element 25a for producing and directing a light beam toward the rotating plate 25c, and a light-sensitive element 25b for receiving the light beam transmitted through slits of the rotating plate 25c, whereby the encoder 25 generates a pulse signal corresponding to the rotation of the rotating plate 25c based on the output of a light-sensitive element 25b. The main CPU 50a is also connected to the encoder 25 to receive the output of the encoder 25 through the interface 50e, and the light-emitting element 25a is connected to the main CPU 50a in the controller 50 through a light-emitting element driver 50g. CPU 50a is adapted to count the number of pulses and to received from encoder 25 the amount and direction of the rotation of feeding roller 21b based on the received pulse signals.

The control panel 61 has a start key 61a, an error lamp 61b and other input keys 61c. Sensors 62 are disposed in the apparatus 1 to transmit signals to CPU 50a to control the apparatus. A sheet feeding unit 63 has a developer sheet feeding portion 63A which controls the feeding of a developer sheet 33, and a microcapsule sheet feeding portion 63B which controls the feeding of a microcapsule sheet 11 and includes the driving source 63B1, and a separator driving portion 63C for driving the separator roller 21d. The exposure unit 64 controls halogen lamp 5a (i.e., turns lamp 5a on and off). Original support stand driver unit 65 controls the original support stand glass 2 to move back and forth. Optical system unit 66 controls lens 7 and mirrors 8,9 so that they are located in a suitable position. Filter driver unit 67 controls the filter 6 so that it is located in a suitable position.

The CPU 50a is further connected to a ROM (read-only memory) 50b and a RAM (random-access memory) 50c. The RAM 50c acts as a work area for performing various types of processing and also stores data temporarilly. ROM 50b stores various types of processing programs and also stores initial data. CPU 50a operates to control the present image forming apparatus, according to one or more control programs stored in ROM 50b, while utilizing the temporary data storage function of RAM 50c.

The arrangement as described above is operated as described below. When the start key 61a in the control panel 61 is pressed, the stand glass 2 is moved rightward in FIG. 1 and brought to a stop at a position where the left end of the glass 2 is to be lighted by halogen lamp 5a. Then, the halogen lamp 5a is turned on, and the light emitted from the lamp 5a is reflected by the original 4 supported on the glass stand 2 and transmitted through the filter 6, the lens system 7 and the reflection mirrors 8,9 to form a latent image on the microcapsule sheet 11.

With the leftward movement of the stand glass 2, a developer sheet 33 is picked up by the sheet feed mechanism 32 from the developer sheet cassette 31 and is laid upon the exposed part of the microcapsule sheet 11 to be fed to the pressure developing unit 22. The microcapsule sheet 11 and the developer sheet 33 are sandwiched and pressed together between the pressure developing rollers 22a, 22b.

The microcapsule sheet 11 and the developer sheet 33 which have left the pressure developing unit 22 are fed by the rollers 21c. The microcapsule sheet 11 is separated from the developer sheet 33 by the separator roll 21d. The microcapsule sheet 11 is directed upwardly, whereas the developer sheet 33 travels ahead into the thermal fixing unit 35.

After color development on the developer sheet 33 is fixed by the thermal fixing unit 35, the developer sheet 33 is discharged into a tray 36 with the developed image facing up. The separated microcapsule sheet 11 travels past the adjustment roller 21e and is wound around the take-up reel 23.

Figure 4:
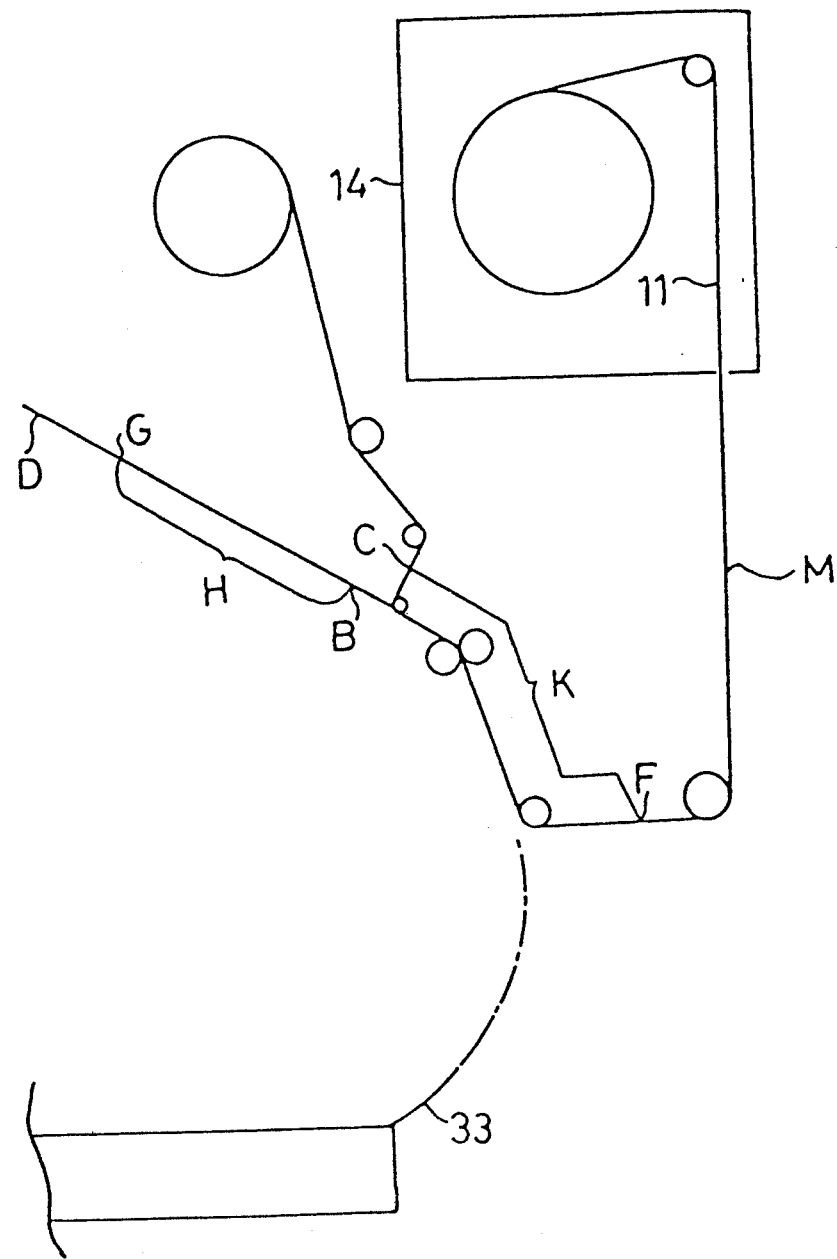
FIG. 4 is a view showing a feeding path of a photosensitive pressure sensitive recording sheet and the length prescribed between predetermined positions along the feeding path.

In this case, the trailing edge of the exposed area of the microcapsule sheet 11 superposed with the developer sheet 33 passes through the separator roller 21d for a perfect separation from the developer sheet and stops at a position C which is controlled to be spaced apart a short distance from the separator roller 21d along a microcapsule feeding path M, as shown in FIG. 4. Therefore, the leading edge of the unused (unexposed) portion following the exposed portion of microcapsule sheet 11 is positioned at the position C described above. If the next copying operation is immediately performed in the above mentioned situation, the unexposed portion of microcapsule sheet 11 provided between the trailing edge of the exposed portion from the preceding copying operation (located at point C) and the exposure position (point F) is wasted.

In order to prevent this waste of the microcapsule sheet 11, the controller 50 controls the microcapsule sheet feeding portion 63B in the sheet feeding unit 63 so that the leading edge of the unexposed portion of the microcapsule sheet 11 is fed from the downstream side of the separator roller 21d (point C) to the exposure position F through the separator roller 21d and the pressure developing unit 22 along the microcapsule sheet feeding path M at a controlled speed. The position F is controlled to be at the lower surface of the exposure table 10. The controller 50 controls the developer sheet feeding portion 63A in the sheet feeding unit 63 so that a trailing edge of developer sheet 33 is fed from the downstream side of said separating roller 21d (point B) to the tray 36 at a controlled speed.

When the developing (separating) operation of the most recent copying operation is completed, the trailing edge of the developer sheet 33 is placed at a position B controlled to be spaced apart a short distance from the separator roller 21d on the upstream side of the thermal fixing unit 35 along a developer sheet feeding path D. When the fixing operation of the copying operation is finished, the trailing edge of the developer sheet 33 is placed at a position G controlled to be spaced apart a short distance from the outlet of the thermal fixing unit 35 along the developer sheet feeding path D. The length H is defined as a length of the feeding path of the developer sheet 33 between the position B and the position G. During the feeding operation from the position C to the position F, the leading edge of the unexposed portion of the microcapsule sheet 11 is placed at a position F disposed at the lower surface of the exposure table 10. The length K is defined as the length of the feeding path of the microcapsule sheet 33 between the position C and the position F.

Prior to manufacturing the present copying machine 1, determinations are made as to the different speeds at which a trailing edge of developer sheets 33 are fed from the position B to the position G through the thermal fixing unit 35, which speed differs depending on the type of material used to make the developer sheet (e.g., whether a base material of the output image sheet is made from paper or polyethylterephalate (PET)). Optimum data V relating to each of these feeding speeds of the developer sheet was thus acquired. Additionally, an experiment was performed to determine the maximum speed which is possible for feeding the leading edge of an unexposed portion of microcapsule sheet 11 from the position C to the position F without causing a paper jam, without damaging the photosensitive recording medium and without causing slipping to occur between the sheet feeding path rollers and the photosensitive recording medium to acquire optimum data S relating to the maximum possible feeding speed of the microcapsule sheet 11.

Accordingly, the time T of feeding of the trailing edge of a developer sheet 33 from position B to position G can be calculated based on the distance and data V according to formula (1) described below:

$$T = H/V. \quad (1)$$

Similarly, the shortest possible time Y for feeding the leading edge of the unexposed portion of microcapsule sheet 11 from the position C to the position F (i.e., over distance K) based on maximum speed S can be calculated according to formula(2) described below:

$$Y = K/S. \quad (2)$$

The data relating to the time Y, the maximum speed S and the optimum speeds V are then stored in ROM 50b.

A CPU 50a controls the developer sheet feeding portion 63A based on this stored data to feed the trailing edge of developer sheet 33 from the position B to the position G at the appropriate speed V, and controls the microcapsule sheet feeding portion 63B based on this stored data to feed the leading edge of an unexposed portion of microcapsule sheet 11 from the position C to the position F at the speed S. The CPU 50a prohibits starting a recording operation even when the start key 61a has been actuated during the time Y during which the leading edge of the unexposed portion of microcapsule sheet 11 is being fed from the position C downstream of said separation device 21d to the position F through the separating device 21d and the developing device 22 along said photosensitive sheet feeding path M.

As described above, one embodiment of a copying apparatus for copying an image onto a recording sheet is provided. The copying apparatus 1 employs a recording sheet comprising an elongated continuous form photosensitive sheet capable of having a latent image of an output image to be formed thereon, and a cut sheet type of a developer sheet 33 which produces an output image upon reaction with the latent image on the photosensitive recording sheet. The copying apparatus 1 comprises an exposing device for exposing an elongated continuous form photosensitive sheet 11 to be fed along the sheet feeding path M to form an image thereon, said exposing device having an exposure position whereat a leading edge of the photosensitive sheet is located prior to recording an image thereon, and a developing device 22 disposed downstream of the exposing device with respect to the sheet path M for developing the exposed photosensitive sheet 11 superposed with the developer sheet 33, and a separating device 21d disposed downstream of the developing device with respect to the sheet feeding path M for separating the exposed photosensitive sheet 11 from the developer sheet 33. Sheet feeding devices are provided and include a developer sheet feeding device 63A for feeding a developer sheet 33 from a stored position to a discharged position through the developing device 22 and the separating device 21d along the sheet feeding path D, and a photosensitive sheet feeding device 63B for feeding a leading edge of an unexposed portion of the photosensitive sheet 11 from a separating device 21d to the exposure position F through the separating device 21d and the developing device 22 along the sheet feeding path M.

The main CPU 50a prohibits starting of a recording operation by the start key 61a during a time Y during which the leading edge of an unexposed portion of the photosensitive sheet 11 is fed from the position C of said separation device 21d to the position F through the separating device 21d and the developing device 22 along said sheet feeding path M.

Next, a second embodiment of the invention will be described below with reference to FIGS. 5-8B. The microcapsule sheet feeding mechanism and the operation of the controller of this second embodiment of the invention is different from the first embodiment. To avoid duplicate description, portions of the second embodiment which are similar to the copying machine shown in FIG. 1 are designated with the same reference numerals and characters.

Figure 5:
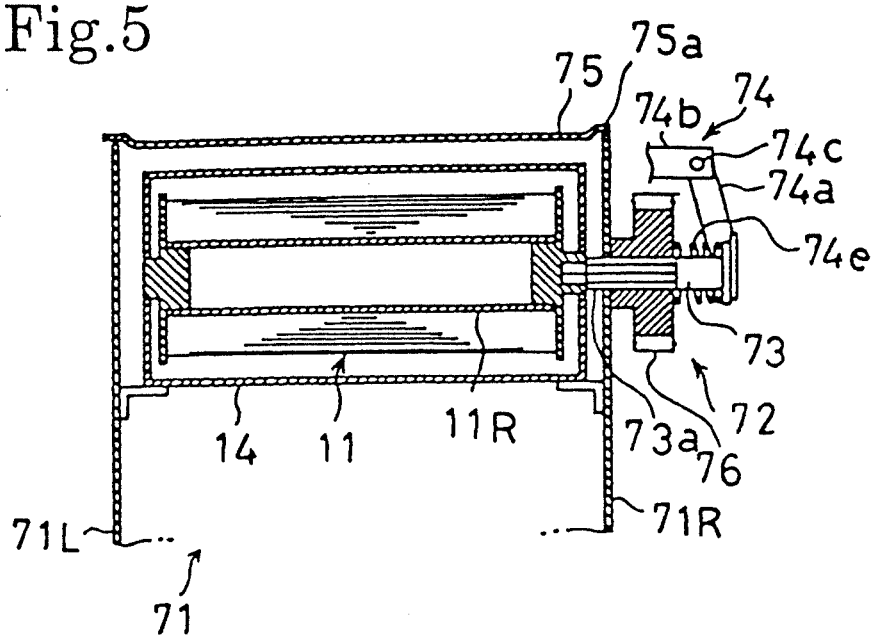
FIG. 5 is a schematic elevational view in cross section of a second embodiment showing a cartridge and a feeding mechanism for feeding the photosensitive pressure sensitive recording sheet.

As shown in FIG. 5, the cartridge 14 is accommodated in an inner frame 71 having a rightside inner frame portion 71R and a leftside inner frame portion 71L. The rotatory driving mechanism 72 for winding the unexposed microcapsule sheet 11 around the cartridge reel 11a and for feeding the unexposed microcapsule sheet 11 to the slot 15 is disposed at the rightside inner frame 71R.

The rotatory driving mechanism 72 includes a shaft 73 which moves back and forth toward and away from the inner frame 71 to be engaged with or disengaged from the cartridge reel 11a. The shaft 73 is connected with a link mechanism 74 for moving the shaft 73 back and forth. A portion 73a of shaft 73 contains a series of splines. The link mechanism 74 comprises a first arm 74a connected with the shaft 73, a second arm 74b connected with the first arm 74a through a pin 74c disposed between the first arm 74a (and thus, bias shaft 73 away from inner frame 71) and the second arm 74b, a coil spring 74e disposed along the shaft 73 to bias against the first arm 74a (and thus, bias shaft 73 away from inner frame 71) and a driving mechanism (not shown) connected with the second arm 74b which moves the second arm 74b back and forth.

The driving mechanism is connected with an inner cover member 75 which covers the cartridge 14 inside the copying machine 1. The inner cover member 75 is hingedly attached to the rightside inner frame 71R through a hinge mechanism 75a disposed between the inner cover member 75 and the rightside inner frame 71R. When the inner cover member 75 is in an open state where the inner cover member 75 is separated from the leftside inner frame 71L by pivoting about hinge mechanism 75a, the link mechanism 74 operates to allow coil spring 74e to expand and move the shaft 73 away from the inner frame 71 due to the bias force of the coil spring 74e so that shaft 73 is disengaged from the cartridge reel 11a. When the inner cover member 75 is placed in a closed state, where the inner cover member 75 contacts the leftside inner frame 71L, the link mechanism 74 operates to move the shaft 73 toward the inner frame 71 against the force of coil spring 74e so that shaft 73 is engaged with the cartridge reel 11a.

Figure 6:
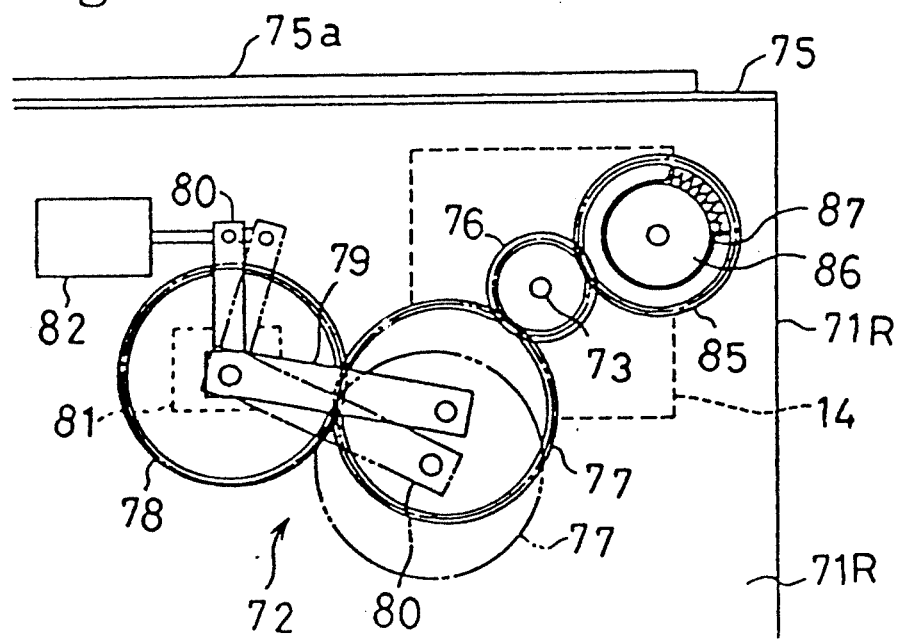
FIG. 6 is a schematic elevational view of the second embodiment showing a feeding mechanism for feeding the photosensitive pressure sensitive recording sheet.

The rotatory driving mechanism 72 includes a rotatory driven gear 76 located on the spline portion 73a of shaft 73 and is fixed thereto so as to be slidable on, yet rotatable with the shaft 73. Thus, the shaft 73 can be moved back and forth toward and away from the inner frame 71R by sliding through gear 76. As shown in FIG. 6, the rotatory driven gear 76 is coupled with a rotatory driving motor 81 through an intermediate gear 77 and a driving gear 78 in the rotatory driving mechanism 72. A long arm 84 of an L-shaped crank member 79 couples the intermediate gear 77 with the driving gear 78 and maintains a predetermined distance between the center axis of the intermediate gear 77 and the center axis of the driving gear 78 so as to transmit the rotation of the driving gear 78 to the intermediate gear 77.

The center axis of the L-shaped crank member 79 is coupled with the center axis of the driving gear 78, and the end of a short arm 80 of the L-shaped crank member 79 is connected with a shaft of a solenoid 82. When the solenoid 82 operates to move the shaft of the solenoid 82 leftward (in FIG. 6), the L-shaped crank member 79 pivotally rotates counterclockwise about the center of the axis of the driving gear 78 to engage the intermediate gear 77 with the rotatory driven gear 76 (shown as a solid line in FIG. 6). When the solenoid 82 operates to move the shaft of the solenoid 82 rightward, the L-shaped crank member 79 pivotally rotates clockwise about the center of the axis of the driving gear 78 to disengage the intermediate gear 77 from the rotatory driven gear 76 (shown in phantom line).

The rotatory driving motor 81 operates to rotate the rotatory driven gear 76 through the intermediate gear 77 for winding the unexposed microcapsule sheet 11 around the cartridge reel 11a and for feeding the unexposed microcapsule sheet 11 to the slot 15. The amount of feeding of the microcapsule sheet 11 is controlled on the basis of the detection of an encoder 92. The rotatory driven gear 76 is engaged with a gear 85, and this gear 85 is coaxially provided with a brake drum 86 to prevent the shaft 73 from rotating counterclockwise (as shown in FIG. 6) by an excessive amount. The brake drum 86 is coaxially supported with a brake band 87 so that brake band 87 applies a brake force to the brake drum 86.

Figure 7:
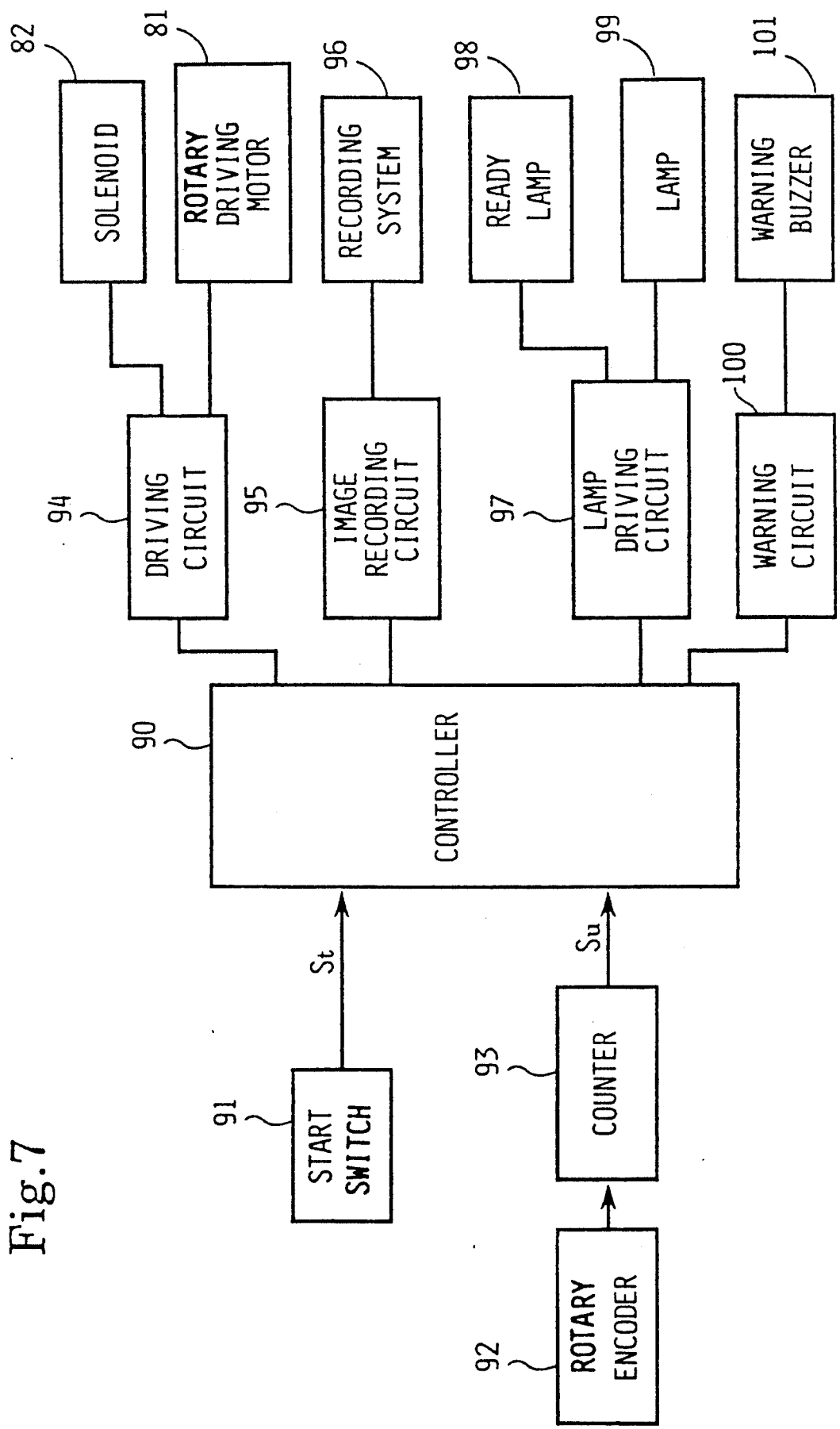
FIG. 7 is a schematic block diagram showing a controller which includes an electrical control circuit of the second embodiment.

The controller 90, as shown in FIG. 7, includes a main CPU (central processing unit) connected to a start switch 91 and also includes a plural copying set key (not shown) to record a plurality of images sequentially from a single operator actuation, which operation generates a signal including pulse St and additional data relating to a number of plural copies to be made. Controller 90 is also connected to a rotatory encoder 92 through a counter 93 which counts pulses generated by the rotatory encoder 92 and generates a pulse Su, a driving circuit 94 for rolling microcapsule sheet 11 onto and off of the cartridge reel 11a which driving circuit 94 also includes the solenoid 82 and the rotatory driving motor 81, an image recording circuit 95 connected to image recording system 96 for recording an image on a microcapsule sheet 11 and a developer sheet 33, a lamp driving circuit 97 connected to a ready lamp 98 and a lamp 99 for indicating an operation mode in which the operation of winding or unwinding the microcapsule sheet 11 around the cartridge reel 11a is being performed, and a warning circuit 100 for sounding a warning buzzer 101 to warn a user that the starting of a recording operation is prohibited even though start switch 91 has been actuated because winding of the microcapsule sheet 11 around the cartridge reel 11a is being performed.

Figure 8A:
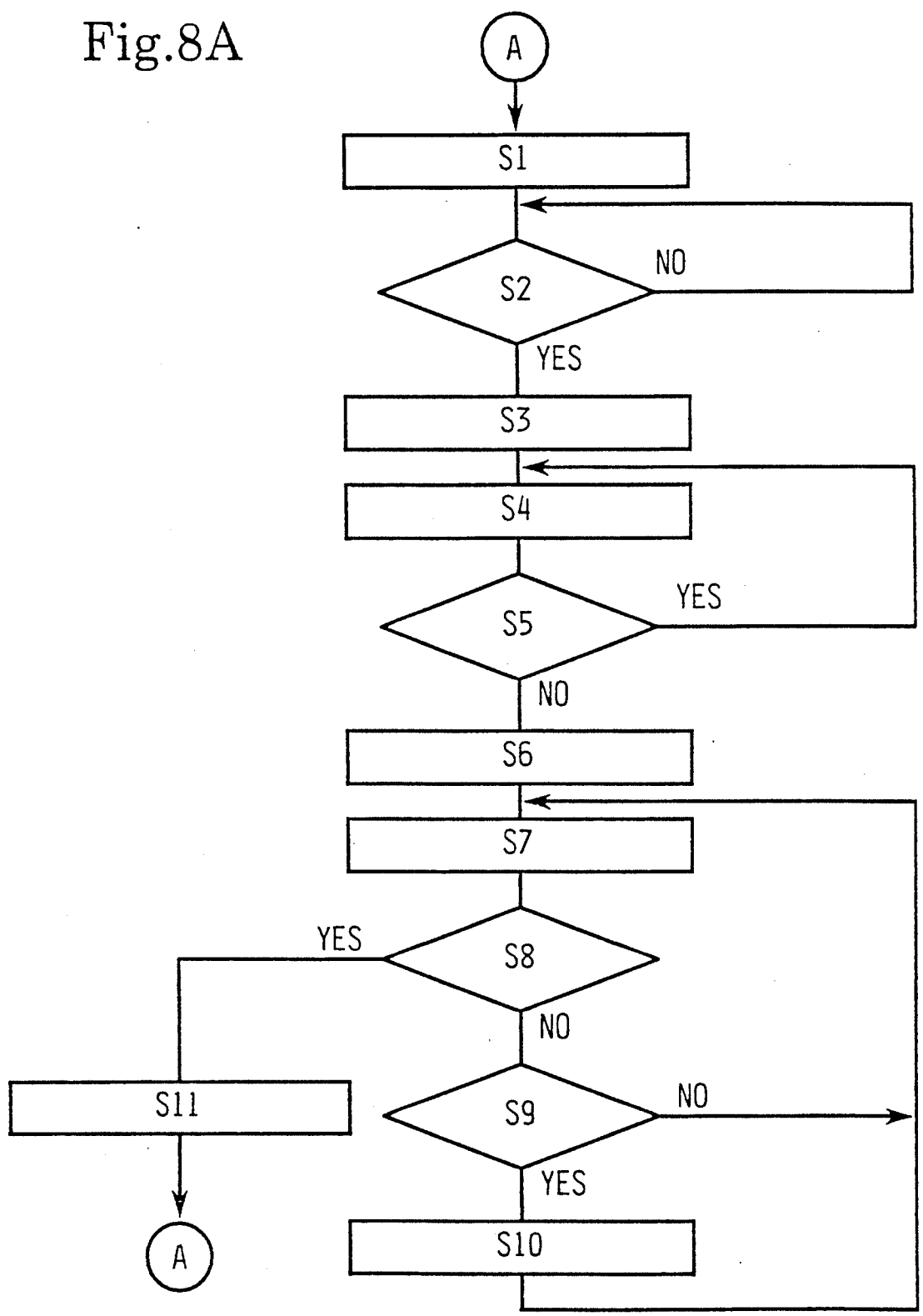

The operation of the second embodiment will be described with reference to the flow chart shown in FIGS. 8A and 8B. When the copying machine 1 is ready for recording an image on the microcapsule sheet 11, the controller 90 turns on the ready lamp 98 to indicate the ready state of the copying machine 1 (step 1, hereinafter indicated simply by S1; the following steps are indicated in a like manner). The controller 90 always detects whether or not a pulse St has been inputted from the start switch 91 which input indicates the starting of a recording operation (S2).

When a user actuates the start switch 91, the controller 90 detects a pulse St input from the start switch 91 (Yes at S2). The controller 90 turns off the ready lamp 98, and turns on the lamp 99 to indicate the operation of recording an image on a microcapsule sheet 11 and a developer sheet 33 (S3). The controller 90 also starts to record an image on a microcapsule sheet 11 and a developer sheet 33 (S4).

The controller 90 detects whether the signal input from the start switch 91 also includes data that indicates the operation of the plural copying sets key to record a plurality of images sequentially in S5. When the controller 90 detects a signal input from the start switch 91 that indicates the operation of the plural copying sets key to record a plurality of images sequentially (Yes at S5), the controller 90 records a plurality of images sequentially on a microcapsule sheet 11 and a series of developer sheets 33(S4).

The controller 90 flashes lamp 99 to indicate the end of operation of recording an image on microcapsule sheet 11 and a developer sheet 33 of the copying machine 1 (S6). The controller 90 then operates the appropriate feeding mechanisms to roll-up the microcapsule sheet 11 around the cartridge reel 11a by the predetermined amount of feeding(S7) to place the leading edge of the unexposed portion of microcapsule sheet at the exposure position F. The controller 90 detects the end of operation of rolling-up the microcapsule sheet 11 around the cartridge reel 11a by the predetermined amount of feeding in S8.

When the controller 90 detects the end of the rolling-up operation (Yes at S8), the controller 90 turns off the lamp 99, thus indicating that the leading edge of the unexposed portion of microcapsule sheet 11 is now at exposure position F by having wound microcapsule sheet 11 around the cartridge reel 11a by the predetermined amount of feeding (S11). After the controller 90 completes the operation of step 11, the controller 90 advances to step 1. When the controller 90 does not detect the end of the rolling-up operation (No at S8), the controller 90 detects whether a pulse St has been input from the start switch 91 that indicates the start of operation to record an image (S9). When the controller 90 detects a pulse St inputted from the start switch 91 (Yes at S9) the controller 90 operates the warning circuit 100 which sounds buzzer 101 for warning a user that the starting of a recording operation is prohibited even though start switch 91 has been actuated because winding of the microcapsule sheet 11 around the cartridge reel 11a is being performed. When the controller 90 does not detect that a pulse St has been input from the start switch 91 (No at S9) the controller 90 advances to step S7. When the controller 90 detects a pulse St inputted from the start switch 91 (Yes at S9), a warning buzzer 101 buzzes to warn a user as described above whether controller proceeds to S7.

Thus, the above control routine does not feed photosensitive recording medium back towards cartridge 14 when operating in the plural copying sets mode. Thus, the speed at which plural copies are produced is given a higher priority than preventing the waste of unexposed photosensitive recording medium.

Additionally, the present invention is usable with an image recording device which uses a single sheet type of image recording medium, such as disclosed in U.S. Pat. No. 4,801,976. In such a device, the output image sheet which contains the developed image is a portion of the same sheet which contains the photosensitive recording material, which portion is exposed, developed, and separated from the unexposed portion of the photosensitive sheet by, for example, cutting. This differs somewhat from the two sheet type of image recording medium illustrated in the present specification where the output image sheet is a developer sheet, separate from the photosensitive sheet. However, all of the above described advantages and objects are achieved when the present invention is applied to a machine which uses the single sheet type of recording medium as opposed to a machine which uses the two sheet type of recording medium.

While this invention has been described in conjunction with specific embodiments thereof, it is evident that many alternative, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An image recording apparatus comprising:
    a recording medium including: an elongated continuous form photosensitive recording medium capable of receiving an image to be formed, and a cut sheet type of a developer recording medium which provides an output image upon reaction with the photosensitive recording medium;
    starting means for starting the operation of recording an image on the photosensitive recording medium upon actuation by a user;
    exposing means for exposing the elongated continuous form photosensitive recording medium fed along a photosensitive recording medium feeding path to a light image, said exposing means having an exposure position whereat a leading edge of a portion of the photosensitive recording medium is located prior to exposure thereof to the light image;
    developing means, disposed downstream of said exposing means with respect to the photosensitive recording medium path, for developing the exposed photosensitive recording medium superposed with the developer recording medium;
    separating means, disposed downstream of said developing means with respect to the photosensitive recording medium feeding path, for separating the exposed photosensitive recording medium from the developer recording medium;
    photosensitive recording medium feeding means for feeding a leading edge of an unexposed portion of the photosensitive recording medium from a position adjacent to the separating means to the exposure position through the developing means along the photosensitive recording medium feeding path; and
    prohibiting means for prohibiting the starting of a recording operation when said starting means is actuated during the time at which the leading edge of the unexposed portion of the photosensitive recording medium is being fed from the position adjacent to said separating means to the exposure position through the developing means along said photosensitive recording medium feeding path.

2. The image recording apparatus as defined in claim 1, wherein a leading edge of the unexposed portion of the photosensitive recording medium it placed at said position adjacent to said separating means after the separating operation of a preceding copying operation is completed.

3. The image recording apparatus as defined in claim 1, wherein said prohibiting means comprises a CPU, a ROM, and a RAM, said ROM being provided with programs for prohibiting the starting of the recording operation.

4. The image recording apparatus as defined in claim 1, further comprising:
    means for placing said apparatus in a plural copy set mode of operation wherein plural recording operations are performed to produce plural recordings of an image sequentially upon a single user actuation thereof, said prohibiting means being overridden during said plural copy set mode of operation.

5. The image recording apparatus as defined in claim 1, further comprising:
    means for sounding an alarm when said starting means is actuated during the time at which the leading edge of the unexposed portion of the photosensitive recording medium is being fed from the position adjacent said separating means to said exposure position.

6. An image recording apparatus comprising:

a recording medium including: an elongated continuous form photosensitive recording medium capable of receiving an image to be formed, and a cut sheet type of a developer recording medium which produces an output image upon reaction with the photosensitive recording medium;

starting means for starting the operation of recording an image on the photosensitive recording medium upon actuation by a user;

exposing means for exposing the elongated continuous form photosensitive recording medium fed along a photosensitive recording feeding path to a light image, said exposing means having an exposure position whereat a leading edge of a portion of the photosensitive recording medium is located prior to exposure to the light image;

developing means, disposed downstream of said exposing means with respect to the photosensitive recording medium path, for developing the exposed photosensitive recording medium superposed with the developer medium;

separating means, disposed downstream of said developing means with respect to the photosensitive recording medium feeding path, for separating the exposed photosensitive recording medium from the developer recording medium, said separating means having a separating point whereat a leading edge of an unexposed portion of the photosensitive recording medium is located after being separated from the developer medium;

first photosensitive recording medium feeding means for feeding said photosensitive recording medium from an upstream side of said exposure position to a downstream side of the separating point through the developing means and the separating means along said photosensitive recording medium feeding path;

second photosensitive recording medium feeding means for feeding said photosensitive recording medium from said downstream side of said separating point to said exposure position through the separating means and the developing means along said photosensitive recording medium feeding path; and prohibiting means for prohibiting the starting of a recording operation when said starting means is actuated during the time at which the leading edge of the unexposed portion of said photosensitive recording medium is being fed from the downstream side of said separating point to the exposure position through the separating means and the developing means along said photosensitive recording medium feeding path.

7. The image recording apparatus as defined in claim 6, wherein said leading edge of the unexposed portion of the photosensitive recording mediums is placed downstream of said separating point after the separating operation of a preceding copying operation is completed.

8. The image recording apparatus as defined in claim 6, wherein said prohibiting means comprises a CPU, a ROM, and a RAM, said ROM being provided with programs for prohibiting the starting of the copying operation.

9. The image recording apparatus as defined in claim 6, further comprising:

means for placing said apparatus in a plural copy set mode of operation wherein plural recording operations are performed to produce plural recordings of an image sequentially upon a single user actuation thereof, said prohibiting means being overridden during said plural copy set mode of operation.

10. The image recording apparatus as defined in claim 6, further comprising:

means for sounding an alarm when said starting means is actuated during the time at which the leading edge of the unexposed portion of the photosensitive recording medium is being fed from the position adjacent said separating means to said exposure position.

11. An image recording apparatus for recording an image on a continuous form photosensitive recording medium which is supplied in a cartridge, the apparatus comprising:

means for receiving a cartridge of continuous form photosensitive recording medium;

exposing means for exposing the elongated continuous form photosensitive recording medium fed along a photosensitive recording medium feeding path to a light image, said exposing means having an exposure position whereat a leading edge of a portion of the photosensitive recording medium is located prior to exposure thereof to the light image;

developing means, disposed downstream of said exposing means with respect to the photosensitive recording medium feeding path, for developing the exposed photosensitive recording medium to form an output image sheet;

separating means, disposed downstream of said developing means with respect to the photosensitive recording medium feeding path, for separating the photosensitive recording medium from the output image sheet;

photosensitive recording medium feeding means for feeding a leading edge of an unexposed portion of the photosensitive recording medium from a position adjacent to the separating means to the exposure position through the developing means along the photosensitive recording medium feeding path;

starting means for starting the operation of recording an image on the photosensitive recording medium upon actuation by a user; and prohibiting means for prohibiting the starting of a recording operation when said starting means is actuated during the time at which the leading edge of the unexposed portion of the photosensitive recording medium is being fed from the position adjacent to said separating means to the exposure position through the developing means along said photosensitive recording medium feeding path.

12. The image recording apparatus as defined in claim 11, wherein the output image sheet is a developer sheet which is separate from said photosensitive recording medium and wherein said separating means separates an exposed portion of the photosensitive recording medium from the developer sheet.

13. The image recording apparatus as defined in claim 12, wherein said developing means develops the photosensitive recording medium by applying pressure to the exposed portion thereof while being superposed with the developer sheet.

14. The image recording apparatus as defined in claim 11, wherein a leading edge of the unexposed portion of the photosensitive recording medium is placed at said position adjacent to said separating means after the separating operation of a preceding copying operation is completed.

15. The image recording apparatus as defined in claim 11, further comprising:

means for placing said apparatus in a plural copy set mode of operation wherein plural recording operations are performed to produce plural recordings of an image sequentially upon a single user actuation thereof, said prohibiting means being overridden during said plural copy set mode of operation.

16. The image recording apparatus as defined in claim 11, further comprising:

means for sounding an alarm when said starting means is actuated during the time at which the leading edge of the unexposed portion of the photosensitive recording medium is being fed from the position adjacent said separating means to said exposure position.

* * * * *